US012672256B2

(12) United States Patent
Farias Moguel et al.

(10) Patent No.: US 12,672,256 B2
(45) Date of Patent: Jun. 30, 2026

(54) IMMERSION COOLING SYSTEM WITH PHORETIC FORCE PARTICULATE COLLECTION

(71) Applicant: Intel Corporation, Santa Clara, CA (US)

(72) Inventors: Oscar Farias Moguel, Morelia (MX); Javier Avalos Garcia, Zapopan (MX); Oscar A. Del Rio Gonzalez, Zapopan (MX); Andres Ramirez Macias, Zapopan (MX); Maria de la Luz Belmont, Zapopan (MX); Jessica Gullbrand, Hillsboro, OR (US); Aravind Munukutla, Hillsboro, OR (US); Anil Kumar Kurella, Hillsboro, OR (US); Samantha Yates, Wilsonville, OR (US)

(73) Assignee: Intel Corporation, Santa Clara, CA (US)

( * ) Notice: Subject to any disclaimer, the term of this patent is extended or adjusted under 35 U.S.C. 154(b) by 408 days.

(21) Appl. No.: 17/556,620

(22) Filed: Dec. 20, 2021

(65) Prior Publication Data

US 2022/0117114 A1 Apr. 14, 2022

(51) Int. Cl.
*H05K 7/20* (2006.01)
*B01D 57/02* (2006.01)
(Continued)

(52) U.S. Cl.
CPC ......... *H05K 7/20236* (2013.01); *H05K 7/203* (2013.01); *B01D 57/02* (2013.01);
(Continued)

(58) Field of Classification Search
None
See application file for complete search history.

(56) References Cited

U.S. PATENT DOCUMENTS 11,059,048 B2 * 7/2021 She .......................... B07B 4/00
11,103,611 B2 * 8/2021 Eide ...................... B01D 53/30
(Continued)

FOREIGN PATENT DOCUMENTS

EP 1069171 A2 1/2001
GB 2601357 A 11/2020
(Continued)

OTHER PUBLICATIONS

European Patent Office, "Communication under Rule 71(3) EPC," issued in connection with European Application No. 22206552.6, dated Jan. 3, 2025, 51 pages.
(Continued)

*Primary Examiner* — Courtney L Smith
(74) *Attorney, Agent, or Firm* — Hanley, Flight and Zimmerman, LLC

(57) ABSTRACT

An apparatus is described. The apparatus includes a particle collector to collect particles from an electrically insulating liquid that one or more electronic devices are to be immersed within. The particle collector having an input port to receive the electrically insulating liquid. The particle collector having an output port to emit the electrically insulating liquid. The particle collector having one or more phoretic force devices. The phoretic force devices to induce phoretic forces within the particle collector that cause the particles to collect within the particle collector. A structure is also described. The structure is to be immersed in electrically insulating liquid and mimic a boiling enhancement layer of a cooling assembly of a chip package disposed on an electronic circuit board that is also immersed in the electrically insulating liquid.

20 Claims, 11 Drawing Sheets

(51) Int. Cl.
      *F23J 15/06*          (2006.01)
      *F24H 1/44*           (2022.01)
(52) U.S. Cl.
      CPC ................. *F23J 15/06* (2013.01); *F24H 1/44*
                    (2013.01); *H05K 7/20272* (2013.01)

(56)                    References Cited

U.S. PATENT DOCUMENTS

| | | | | |
|---|---|---|---|---|
| 2003/0106802 A1* | 6/2003 | Hagiwara | ................. | C25D 3/38 |
| | | | | 205/291 |
| 2014/0150650 A1* | 6/2014 | Walker | ...................... | F24H 1/44 |
| | | | | 165/86 |
| 2021/0320050 A1 | 10/2021 | Robinson et al. | | |
| 2021/0327787 A1* | 10/2021 | Yang | ................... | H01L 23/3735 |
| 2022/0098744 A1* | 3/2022 | Mills | ........................ | C25B 13/04 |
| 2022/0361381 A1* | 11/2022 | Sweeney | ............ | H05K 7/20263 |

FOREIGN PATENT DOCUMENTS

| | | |
|---|---|---|
| GB | 2576032 B | 4/2021 |
| GB | 2576030 B | 12/2021 |
| GB | 2597525 A | 2/2022 |

OTHER PUBLICATIONS

Brenner, Howard, "Phoresis in fluids", Physical Review E 84, 066317 (2011), Dec. 22, 2011, 8 pages, Cambridge, Massachusetts 02139-4307, USA.

Starting on p. 4, paragraphs [0013] through paragraph [0022] only of the non-published U.S. Appl. No. 17/556,620, filed Dec. 20, 2021, pp. 4-6.

European Patent Office, "Extended European Search Report," in connection with European Patent Application No. 22206552.6, issued May 11, 2023, 13 pages.

* cited by examiner

100

107

103

104

COLD 105

HOT

106

102

101

IMMERSION COOLING SYSTEM WITH PHORETIC FORCE PARTICULATE COLLECTION

BACKGROUND

System design engineers face challenges, especially with respect to high performance data center computing, as both computers and networks continue to pack higher and higher levels of performance into smaller and smaller packages. Creative packaging and cooling systems are therefore being designed to keep pace with the thermal requirements of such aggressively designed systems.

FIGURES

A better understanding of the present invention can be obtained from the following detailed description in conjunction with the following drawings, in which.

DETAILED DESCRIPTION

Figure 1:
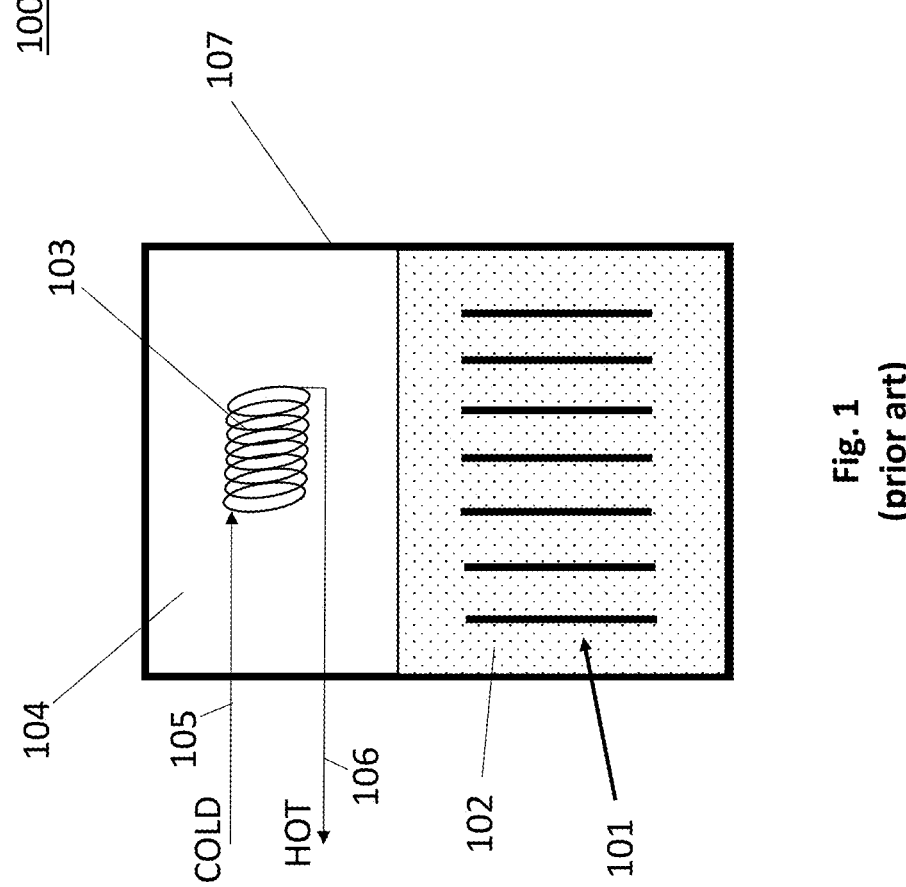
FIG. 1 depicts an immersion cooling system (cooling system)

FIG. 1 depicts one or more electronic circuit boards 101 (PC boards) with mounted electrical components (e.g., semiconductor chips) that are powered on and operating while the boards 101 and their components are immersed in a bath of thermally conducting but electrically insulating liquid 102 within a chamber 107. The complete immersion of the boards 101 and their components maximizes the surface area over which heat from the operating semiconductor chips can be released into the cooling medium (coolant 102). Additionally, as compared to air cooled systems, a liquid generally has a much higher latent heat and specific heat than air, resulting in a much lower thermal resistance between the operating electronics and the cooling medium.

Here, heat from the semiconductor chips that are operating on electronic boards 101 is transferred from the chips/boards to the immersion bath 102. During initial heat up when power dissipation is not high and the heat transfer from the electronic devices to the surrounding liquid 102 is via convection, the temperature of the bath coolant 102 warms in response to the heat from the chips/boards 101 but does not boil (the temperature of the bath coolant 102 remains below the liquid's boiling point). In this case, single phase cooling is cooling mechanism (e.g., via convection).

As the power keeps increasing for a certain period, which, e.g., can be applicable if the chips/boards 101 are continuously operating above a certain power, the liquid in the thermal bath 102 boils and converts from a liquid to a vapor (the temperature of the liquid surrounding the chips/boards exceeds the liquid's boiling point). The vapor from the bath is condensed by a condenser 103. Here, the condenser 103 typically includes a coil or other arrangement of thermally conductive piping (e.g., metal or metal alloy pipes) through which cold water 105 is injected.

The vapor from the bath 102 condenses on the cooled condenser pipes 103, which, in turn, warms the fluid within the pipes 103 causing warmed fluid 106 to exit the chamber 107, and, converts the vapor back to a liquid which subsequently falls back into the bath 102. The removal of warmed fluid 106 from the chamber 107 combined with the return of condensed vapor back to the bath 102 effectively removes heat generated by the chips/boards 101 from the overall system 100. The boiling of a liquid to vapor and the condensation of the vapor to a liquid as described above is referred to as two phase cooling because both liquid and vapor phases are involved in the cooling process.

In other two phase immersion cooling approaches, warmed vapor is drawn out of the chamber 107 and cooled/condensed by into a condenser that is external from the chamber. The external condenser condenses the vapor to a liquid and the cooled liquid is returned to the chamber 107.

The performance of a two-phase immersion cooling improves as the thermal resistance between the operating semiconductor chips and the immersion bath 102 decreases. As such, semiconductor chip packages are enhanced to include structures that help induce boiling of the immersion bath liquid.

Figure 2:
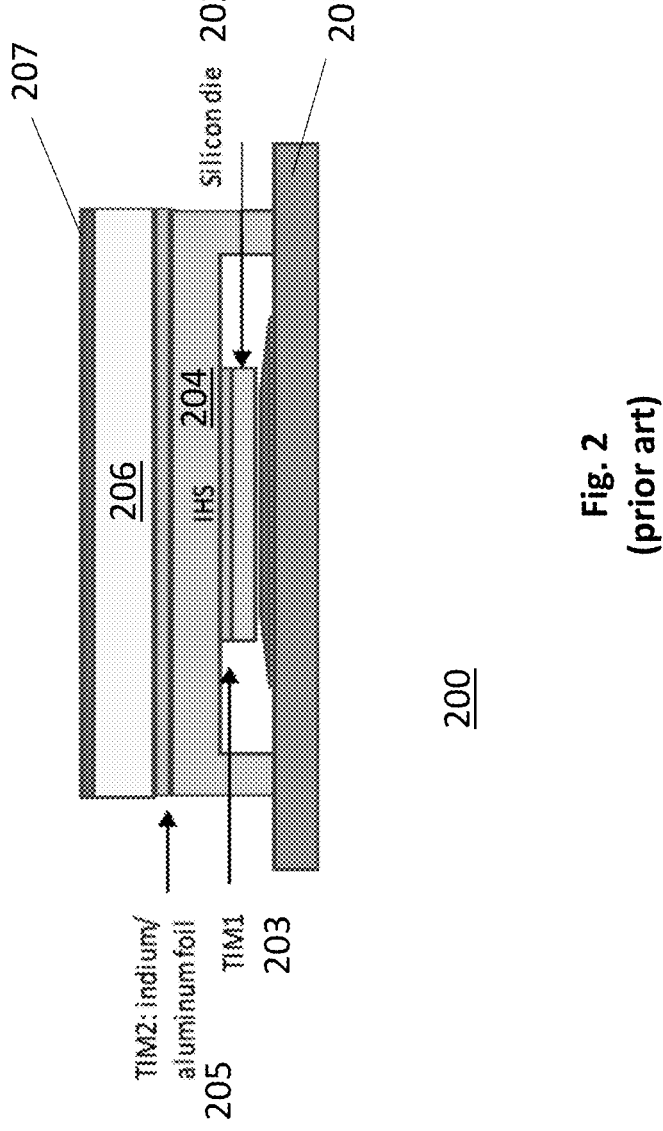
FIG. 2 depicts a chip package cooling assembly for use in an immersion cooling system (prior art)

FIG. 2 shows a prior art structure for transferring heat from a packaged semiconductor chip 202 to an immersion bath. Here, micro-electrical connections (e.g., solder balls, solder bumps, etc.) of the semiconductor chip 202 are mounted to a package substrate which, in turn, is mounted to an electronic circuit board 201. The back side of the silicon chip 202 is attached to a first thermal interface material (TIM) 203 and placed in contact with the underside of the chip package lid 204 (also referred to as an integrated heat spreader (IHS)).

The topside of the IHS 204 is then attached to a second TIM 205. A thermally conductive solid mass block 206 (e.g., a solid block of copper) is placed on the second TIM 205. Importantly, the top surface of the thermally conductive solid mass block 206 has a roughened micro-structure 207 that is formed, e.g., through surface treatment of the solid mass block 206 (e.g., etching, patterning, scratching, etc.), or, through the attachment of a thermally conductive thin film 207 or other structure having a roughened surface topography.

The aforementioned multi-layer structure is designed to transfer heat from the semiconductor chip to the roughened surface 207 with as little thermal resistance as is practicable (a high thermal efficiency is meant to exist between the semiconductor chip 202 and the roughened surface 207). The roughened surface 207 helps nucleate bubbles in the bath when the chip's operational power is above a certain level. Here, in general, irregular (non planar) surface structures (structured surfaces) help nucleate vapor bubbles. As such, the roughened or structured surface 207 is also referred to as a boiling enhancement layer (BEL) 207.

In other approaches, the solid mass block 206 is not present and the BEL 207 is formed directly on the IHS 204. For example, in one approach the BEL 207 is formed as a stack of copper meshes (copper fabric). In another approach, the top surface of the IHS 204 is patterned to include structures so that that the top surface 204 of the IHS is irregular (non-planar).

A problem with two phase immersion cooling systems is the accumulation of unwanted particulates (e.g., organic and/or inorganic residues) on the surface of the BEL 207. Here, the electronic circuit boards 101 that are immersed in the liquid cooling bath 102 expose a number of different materials (e.g., various composites (e.g., FR4, cured epoxies), various metals, various ceramics, various plastics, etc.) to the bath liquid 102. Some of these materials can chemically react with the cooling liquid which creates particulate byproducts (although the immersion bath liquid 102 is electrically insulating, it is generally not entirely chemically inert).

Additionally, the manufacturing and/or installation processes of the various components of the electronic circuit boards 101 and/or the immersion cooling system (e.g., etching, grinding, polishing, spraying, tightening, etc.) can naturally result in the formation of particulates on the outer surfaces of these components which can become suspended in the bath 102 once the immersion cooling system has been constructed and/or the electronic circuit boards 101 have been immersed in the bath 102.

Regardless of the precise mechanisms by which such particulates can come into existence, the immersion bath 102 of a two phase immersion cooling system is apt to can contain them. Unfortunately, the particulates tend to accumulate on the BEL surfaces of the packaged electronic components which can increase the thermal resistance between the operating semiconductor chips and the immersion bath 102 (e.g., the particulate accumulation on the BEL 207 of a particular chip package reduces the thermal efficiency between the BEL 207 and the bath of that chip 202).

The particulates are believed to accumulate on the BEL 207 as a consequence of phoretic forces. Phoretic forces are forces that arise from one or more non-homogeneities within the liquid bath 102. For example, non-uniform temperatures within the bath 102 can create thermophoretic forces, non-uniform pressures within the bath 102 can create barophoretic forces, non uniform fluidic densities within the bath 102 can create pyncophoretic forces and non uniform electrical fields or electrical charge distributions within the bath 102 can create electrophoretic forces.

Here, the turbulence created by the nucleated boiling process around the BEL 207 can result in one or more of the above described non uniformities in the immediate vicinity of the BEL structure 207, which in turn, create phoretic forces around the BEL 207 that draw the particles in the bath to the BEL 207. The particles then react with or otherwise attach to the BEL structure 207. For example, in an approach where the BEL structure 207 is formed with a stack of copper wire meshes, films of copper bromide were observed on the copper wire meshes as a consequence of chemical reaction with particles drawn onto the copper meshes by phoretic forces associated with the bubble nucleation activity that the copper meshes induced.

Figure 3:
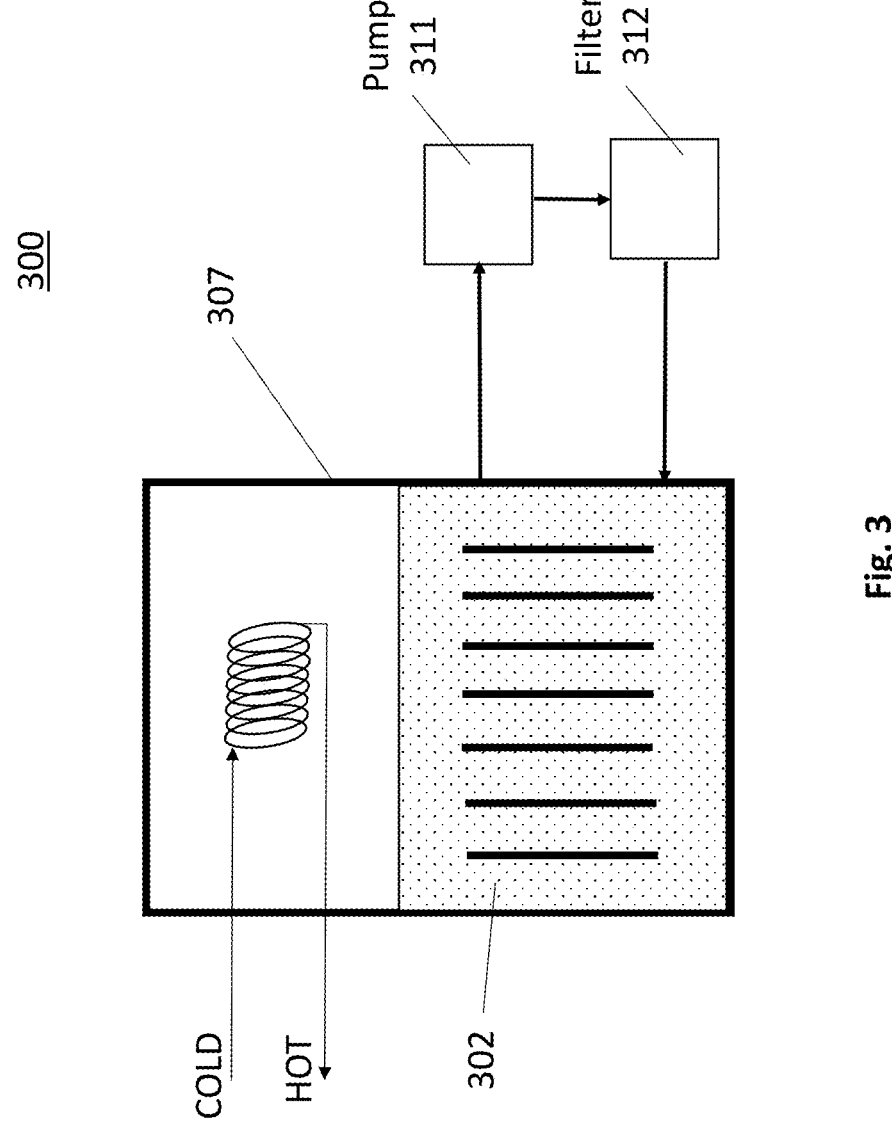
FIG. 3 depicts an immersion cooling system with a filter.

A first solution is observed in FIG. 3 in which a pump 311 and filter 312 are fluidically coupled to the immersion bath chamber 307. The pump 311 continually pumps immersion bath fluid 302 through the filter 312. The filter 312, ideally, collects/traps the particles and a flow of fluid that is free of particulates is injected back into the liquid bath 302. Unfortunately, the filter 312 has limitations with respect to the size of the particles that it can capture and particles that are smaller than the filer's smallest capture size will escape the filter and remain in the bath 302. For example, a single stage activated charcoal filter can capture 10 μm or larger particles while multi-stage activated charcoal filters can capture 1 μm or larger particles. Thus, even if a multi-stage filter is used, particles smaller than 1 μm will still remain in the bath 302.

Figure 4:
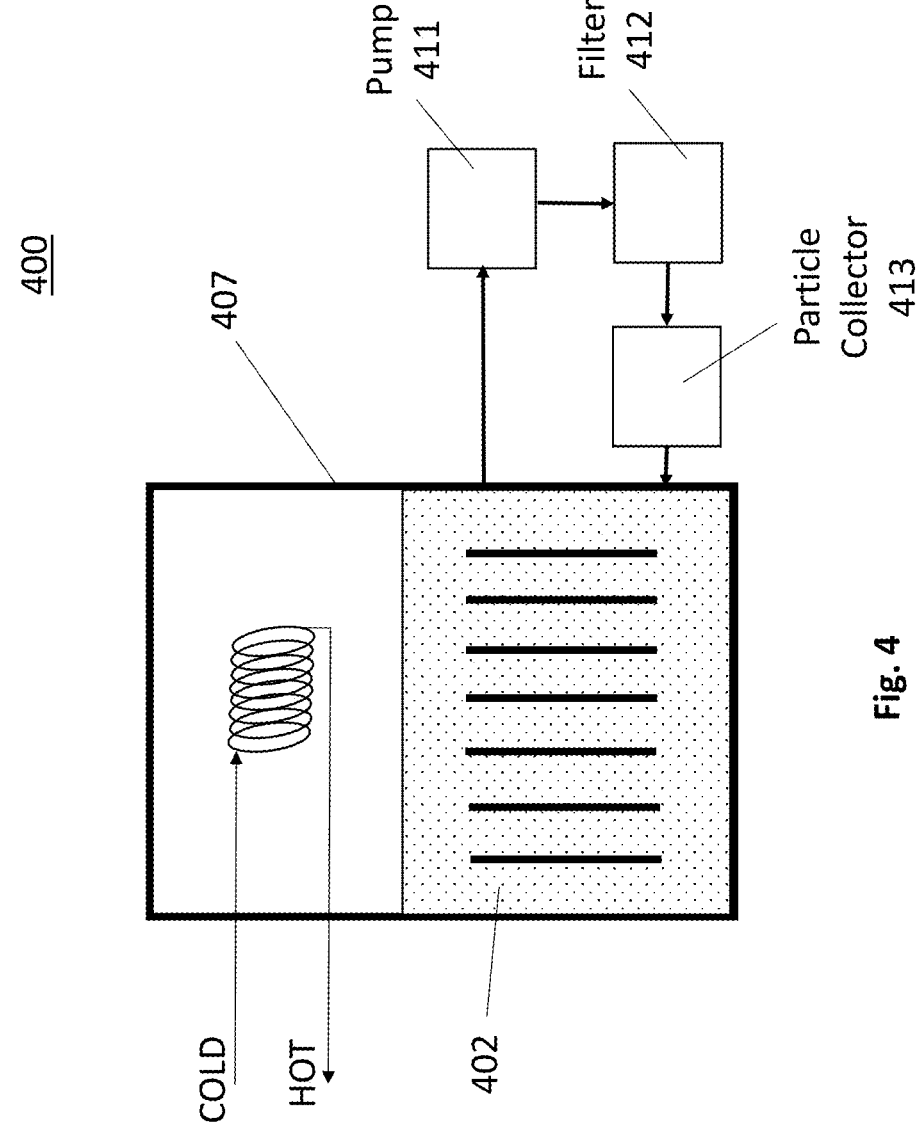
FIG. 4 depicts an immersion cooling system with a particle collector.

FIG. 4 therefor shows an improved approach in which another particle collector is placed, e.g., in fluidic series with the aforementioned filter. As described immediately below, the particle collector 413 is specially designed to capture the smaller particles that escape the nominal filter 412.

Figure 5:
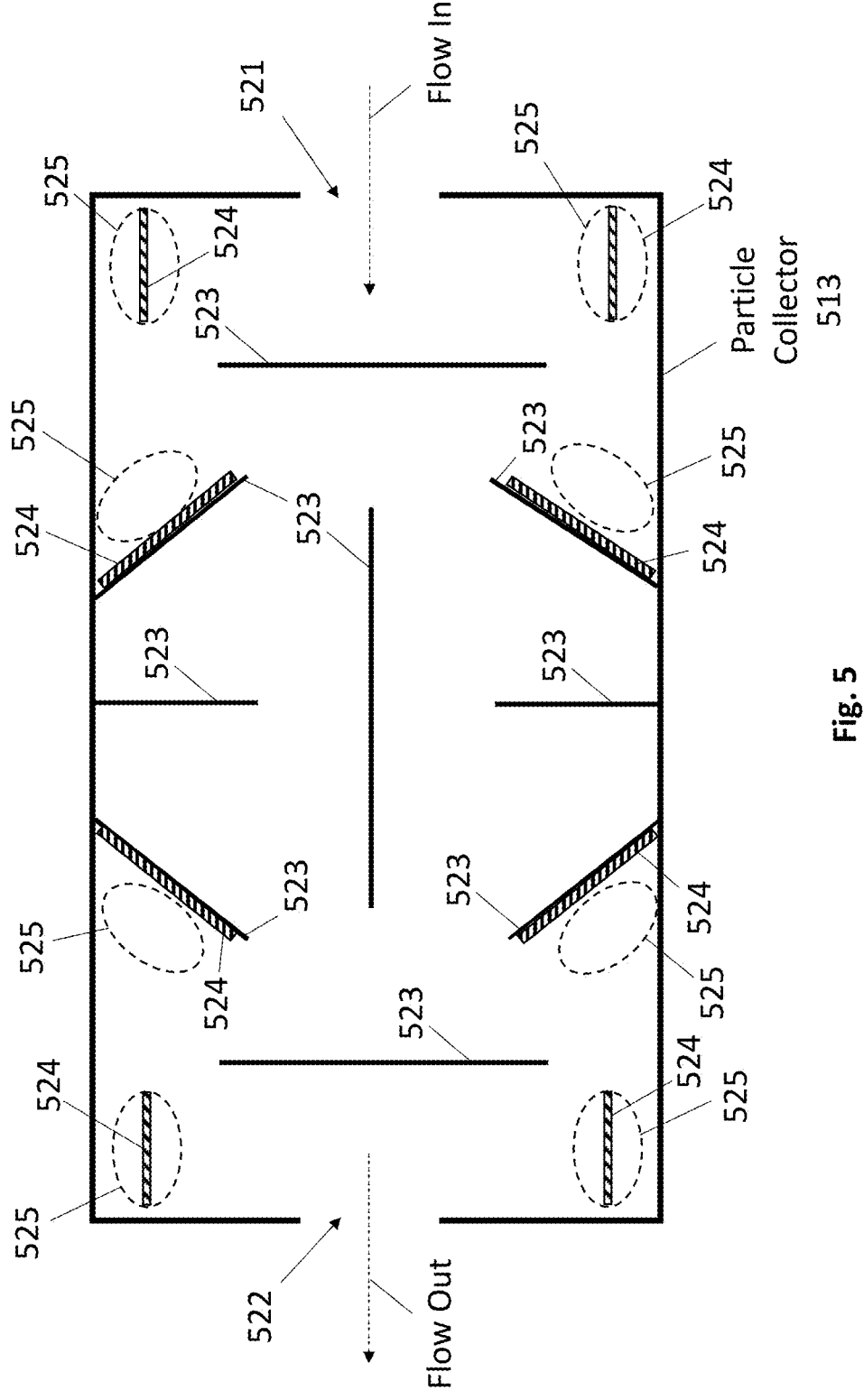
FIG. 5 depicts a design for a particle collector.
Figures 6A, 6B, 6C:
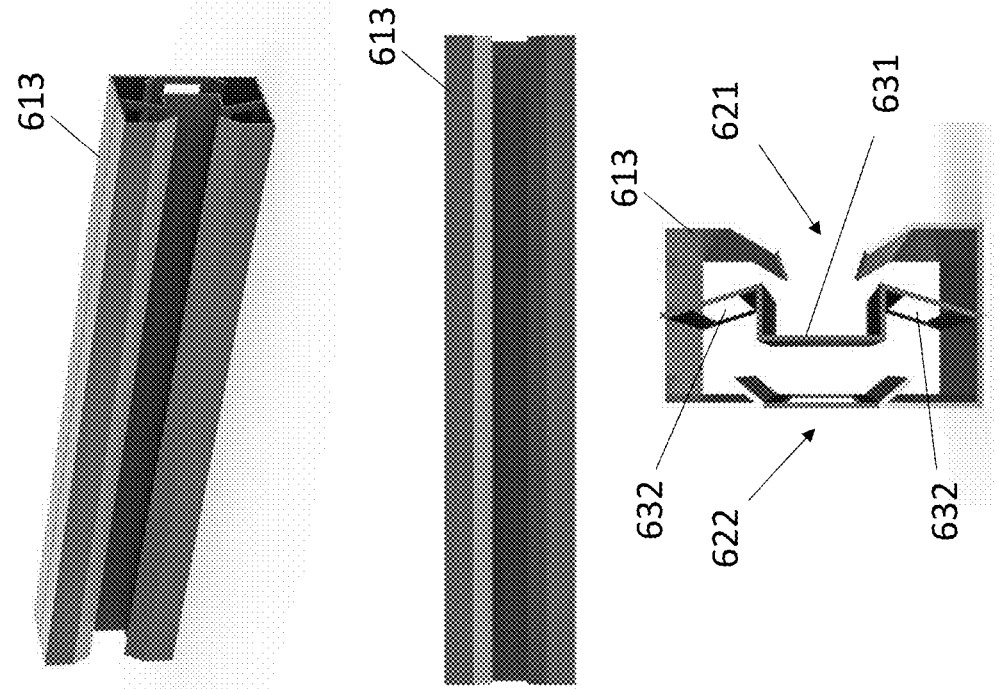
FIGS. 6a, 6b, 6c and 6d depict another design for a particle collector.
Figure 6D:
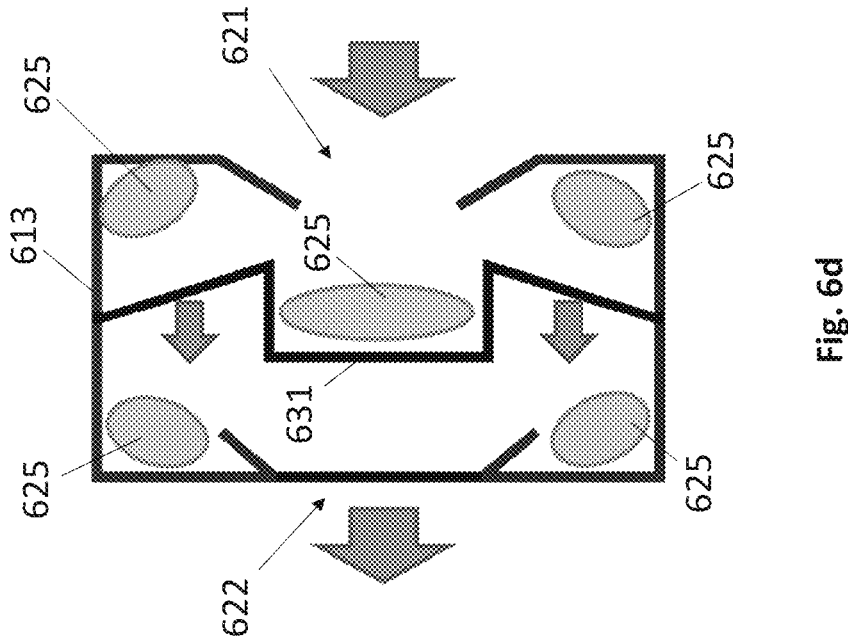

FIG. 5 shows a high level view of a design 513 for the aforementioned particle collector 413. As observed in FIG. 5, the particle collector 513 is implemented as a cannister or other container. The container has an input port 521 and an output port 522. Immersion chamber fluid is pumped into the container via the input port 521. The fluid flows through the container 513 and exits the container via the output port 522. The fluid that exits the exit port 522, ideally, has substantially fewer particles than the fluid that entered the input port 521 and is pumped back into the immersion bath chamber 402.

Importantly, as observed in FIG. 5, the container has a number of baffles 523 and phoretic force inducing devices 524 ("phoretic force devices"). The baffles 523 are designed to provide resistance to the fluid flow through the container 513 so that the velocity of the fluid is reduced while traversing the container 513. In essence, the baffles 523 present a series of blockages that impede forward progress of the fluid through the container 513, and/or, create stagnant areas 525 within the container 513 where fluid hardly moves/flows.

The reduced flow of the fluid makes the particles within the fluid more susceptible (or otherwise more subject) to the phoretic forces applied by the phoretic force devices 524. The phoretic force devices 524 induce one or more non-homogeneities within the container's fluid. Particles within the fluid, including small particles such as particles less than 1 μm, respond to the phoretic forces by accumulating on the phoretic forces devices 524.

In various embodiments the phoretic force devices 524 create temperature non-homogeneities (in which case the phoretic force devices can be implemented with heating elements and/or cooling elements), pressure or density non-homogeneities (in which case the phoretic force devices can be implemented with devices that induce some physical agitation to the liquid (e.g., a transducer, a vibrator, a prop, etc.)), and/or electrical non-homogeneities (in which case the phoretic force devices can be implemented with electrodes having fixed or varying electrical potentials (voltages)).

In even further embodiments, the phoretic force devices 524 are designed to mimic one or more of the BEL structures on the semiconductor chip packages that are dispersed in the immersion bath. For example, according to one approach, the phoretic force devices 524 are implemented as stacks of copper meshes that are heated (e.g., by being placed on a heater or by driving electrical current through them). Here, the heated copper meshes mimic the BELs of the chip packages in the immersion bath.

Upon the copper meshes being heated to a sufficiently high temperature, the meshes will nucleate bubbles in the liquid flowing through the particle collector 513 which, in turn, creates corresponding phoretic forces that are the same or similar to the phoretic forces that exist proximate to the BELs within the immersion bath. As such, the meshes in the particle collector 513 are apt to draw and collect precisely the same kinds of particles that the chip package BELs in the immersion bath are apt to collect.

To the extent the phoretic force devices 524 create bubble nucleation, the particle collector 513 can include an ambient above the liquid (not shown in FIG. 5) and a condenser within the ambient (not shown in FIG. 5) such that the particle collector 513 behaves akin to an immersion cooled system. In this case, the cooling/condensation is intended to reduce internal pressures created by the vaporization of the fluid within the particle collector by the phoretic force devices.

As observed in FIG. 5, the phoretic force devices 524 can be separate from the baffles 523 or be integrated with the baffles 523. Generally, the phoretic devices 524 should be individually placed in strategic areas of stagnant or reduced flow 525, which can include areas that are near a baffle 523 or areas that are not near a baffle 523.

As another example, in an embodiment, various ones of the baffles 523 are composed of metal and are coupled to a positive voltage whereas other ones of the baffles 523 are composed of metal and coupled to a negative voltage (the phoretic devices and the baffles are the same structure). Electric fields emanate from the positively charged baffles and terminate at the negatively charged baffles thereby creating electrical non-homogeneities which induce electrophoretic forces. Ideally, the baffles are constructed and subjected to voltages in such a manner that results in the electric field lines passing through stagnant or greatly reduced fluidic flow areas of the particle collector.

As discussed above, as the phoretic devices 524 generate phoretic forces and the immersion bath fluid is pumped through the particle collector 513, particles within the fluid will begin to collect on the phoretic devices 524.

In one embodiment, referring back to FIG. 4, the immersion cooling system is constructed (including the integration of the particle collector) and then the electronic circuit boards 401 are immersed in the immersion bath 402. However, the electronic circuit boards 401 are not powered up and made operational. Instead, the pump 411 that drives fluid through the particle collector 413 is activated and immersion bath coolant 402 circulates within the immersion bath chamber 401, the filter 412 and the particle collector 413. To the extent the phoretic devices within the particle collector 413 require power, the power is supplied to the phoretic devices such that they are operational.

In this state, the particle collector 413 will collect particles that are in the immersion bath 402 as of the moment of its construction and the immersion of the electronic circuit boards 401. The pump 411 then continues to pump and the phoretic devices continue to operate while immersion bath fluid 402 circulates through the particle collector 413. After some amount of time (e.g., 12 hours, 24 hours, etc.) substantial amounts of the immersion bath liquid 402 will have circulated through the particle collector 413 one or more times resulting in the collection of substantial amounts of particles that were originally within the immersion bath 402.

The immersion bath 402 is then deemed to be "cleaned" of particles, at which point, the electronic circuit boards 401 are powered up and made operational. To the extent the amount of remaining particles that remain in the bath are deemed unimportant and/or the powering up of the circuit boards 401 does not create more particles in the bath 402, the particle collector 413 can be decoupled from the immersion bath 402 (physically or by shutting off the pump 411 that feeds the particle collector 413).

By contrast, to the extent there is a desire to continue to try to remove the remaining particles and/or the powering up of the circuit boards 401 creates more particles, the particle collector 413 and pump 411 remain active and continue to collect particles while the circuit boards 401 operate. In this case, the phoretic force devices can be periodically removed from the particle collector 413 and cleaned of particles before being reinserted back into the particle collector 413.

FIGS. 6a, 6b, 6c, and 6d show various views of one embodiment of a particle collector 613. As observed in FIGS. 6a, 6b, 6c, and 6d, the particle collector 613 itself includes an entrance port 621 and an exit port 622. Here, fluid flows through the entrance port 621 and exits the exit port 622. A middle wall 631 initially impedes fluid that enters the input port. The fluid then eventually flows through smaller holes 632 in the middle wall 631. The fluid then exits from the exit port 622.

The combination of the middle wall 631, the smaller holes 632 and multiple irregular wall features which act as baffles, areas of minimal fluid flow 625 (e.g., stagnant areas) are found in the corners of the particle collector 613 and the main blocking area of the middle wall 613. These same characteristics contribute to the slowing of the fluid's flow through the particle collector.

In an embodiment, the middle wall 631 is a separate metal piece than the outer wall and is electrically insulated from the outer wall (e.g., the middle wall 631 is held by a plastic frame that is mounted to the outer wall). The electrical isolation allows the middle wall 631 to have a different electrical potential than the outer wall which, in turn, creates the formation of electrical field lines through the stagnant areas 625. For example, if the middle wall 631 is given a positive voltage and the outer wall is given a negative voltage, electric field lines will flow from the middle wall 631 to the outer wall through the stagnant areas 625.

Although embodiments discussed above have indicated that the particle collector 413 is external from the chamber 407, in various embodiments the particle collector 413 can be within the chamber 407. For example, the input port of the particle chamber 413 can be located/placed where the pumped fluid returns to the chamber 407 (e.g., at the input port of the chamber 407).

Figure 7:
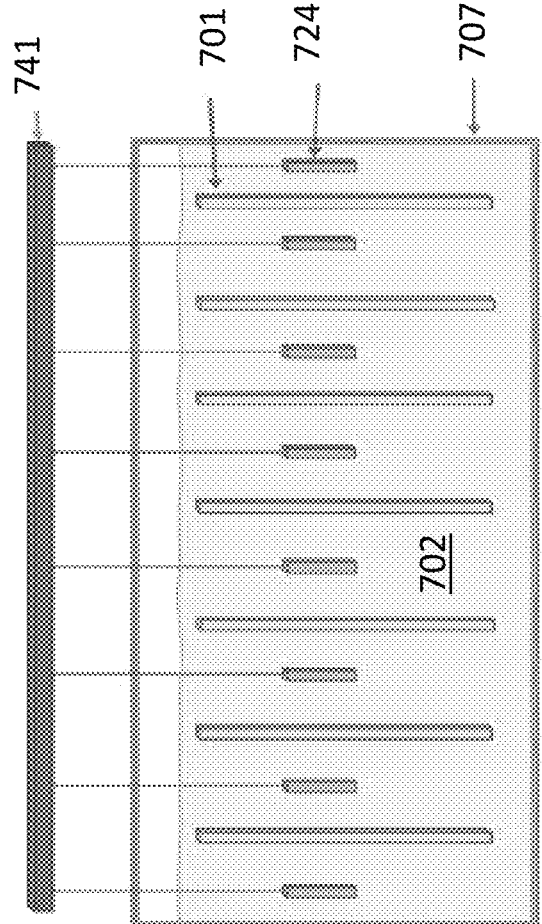
FIG. 7 depicts phoretic devices immersed in an immersion bath.

FIG. 7 shows another approach in which phoretic devices 724 are suspended within the liquid bath 702 of the two phase immersion cooling chamber 707. In the particular approach of FIG. 7, the phoretic devices 724 are suspended in the bath 702 in between the electronic circuit boards 701 by a support arm 741. In an embodiment, the phoretic devices 724 are stacks of copper meshes that are heated by driving an electrical current through them or through a heating element that the meshes are stacked upon (support arm 741 can include electronic circuitry that drives the current through the devices/heaters).

Here, similar to the approach described above, after the electronic circuit boards 701 are immersed in the bath 702 they are not powered up. Rather, the phoretic devices 724 are activated (e.g., current is driven through the wire meshes). The activation of the phoretic devices 724 creates phoretic forces in the bath 702 in the vicinity of the devices 724, which, in turn, causes particles to collect on the devices 724. In a further embodiment, one or more props are strategically placed within the bath 702 so that their rotational motion causes the liquid in the bath 702 to swirl. Ideally, a particle anywhere in the bath 702 will eventually be carried by the swirl(s) in the vicinity of at least one of the devices 724 and accumulate on it.

In further embodiments, the phoretic devices 724 are replaced with sensors, or, sensors are added to the immersion bath 702 in addition to phoretic devices 724 (for ease of drawing, sensors are not depicted in FIG. 7). Sensors are different than phoretic devices 724 in that sensors do not actively create phoretic forces in their vicinity so as to induce particulate precipitation. Rather, sensors are more passive and rely mainly on their material composition to react with particulates in the immersion bath 702. Depending on sensor type, the reaction causes the sensor's material composition to degrade such that the sensor has wear-out, is sacrificial and/or needs to be periodically replaced with a new sensor.

In various embodiments, a sensor is designed to detect the presence of a specific material that is believed to be a potential contaminant within the immersion bath 702. Here, referring briefly back to FIG. 2, both the BEL layer 207 (e.g., stacked copper meshes) and the solid mass block 206 are typically composed of metal (e.g., copper). Halogens (fluorine (F), chlorine (Cl), and bromine (Br)) readily react with metals to form a metal halide. Thus, the kinds of particles that are apt to deposit on a metal BEL 207 and/or a metal mass block 207 are those particles composed of materials that react with the metal (such as halogens).

Recalling from the discussion above that deposits of copper bromide have been observed on a copper mesh BEL layer 207, it is notable that copper bromide is a metal halide composed of copper as the metallic component and bromine (Br) as the halogen component. In this case then, sensors could be placed in the immersion bath 702 that are composed of metal (e.g., copper, silver) so that they will react with the bromine in the immersion bath 702 (e.g., to form a metal halogen of the type X-bromide).

Although the specific sensor embodiments above can be directed to a two phase cooling system, more generally, sensors can also be used in single phase immersion cooling systems (in single phase immersion cooling, the electronics are cooled in liquid, e.g., via convection, such that boiling and condensation of resulting vapor are not relied upon as a principle cooling mechanism). To the extent single phase cooling systems have specific particulates, a sensor can be designed having a surface material that reacts with one or more these particulates.

A sensor can signal the presence of the particulate it is designed to detect in different ways. According to a first type of sensor, referred to as a "coupon" sensor, the sensor changes its appearance upon the deposition of the particulate on its surface. For example, a coupon sensor composed of copper foil will change color from the natural brown-orange color of pure copper to a greenish color upon the deposition of copper bromide on its surface.

According to a second type of sensor, the sensor generates an electronic signal in response to the deposition of the particulate on its surface. In this case, for example, the sensor has first and second electrodes such that an electronic path exists between the electrodes that includes the surface of the sensor upon which the particle accumulates. As particles accumulate on the surface the resistance between the electrodes changes which can be used to generate an electronic signal. For example, if a voltage is placed on the electrodes the current that flows through the electrical path will change, or, if a current is driven through the electrical path, a voltage across the electrodes will change.

A technician can observe the sensors to understand the extent to which the particulate is present in the immersion bath. For example, the extent of the color change or the extent of the resistance change can be used to make an assessment of the amount of particulate in the immersion bath. These observations can be particularly useful when making a determination as to whether or not the particle collector has operated for a long enough period of time, prior to power-up of the electronic circuit boards, to sufficiently clean the immersion bath.

For example, after the particle collector has run for some period of time prior to power-up of the electronic circuit boards (e.g., 12 hours, 24 hours, etc.), the sensors can be added to the immersion bath. If excessive change is observed in the color/resistance of the sensors, the immersion bath is deemed not to be sufficiently clean and the particle collector continues to run while the electronic circuit boards remain powered off. The process then repeats, e.g., with a fresh set of sensors or with the same sensors having been cleaned of the particulate. If excessive change is not observed in the color/resistance of the sensors, the immersion bath is deemed to be sufficiently clean of the particulate and the electronic circuit boards are allowed to be powered up.

In another embodiment, the particle collector is not present and the sensors by themselves are used to determine if the immersion bath is sufficiently clean of particles. That is, for example, electronic circuit boards are placed into the immersion bath but are kept in a powered off state. The sensors are placed in the immersion bath. A period of time is then allowed to elapse in which particles, if they were present in the bath in undesirable concentrations, would cause the sensors to change color or resistance. If after the elapsed time period the sensors do not reveal such change, the electronic circuit boards are permitted to be powered up. This particular process can be performed with or without a particle collector operating in the background to remove particles from the immersion bath.

Sensors can also be used/monitored during operation of the electronics for real time monitoring. That is, the sensors can be used before the electronics are powered up (e.g., to ensure the immersion chamber is sufficiently clear of particles). Thereafter, the sensors can continue to be monitored after the electronics are powered up and running to ensure that the immersion bath is sufficiently clean of particles.

Figure 8:
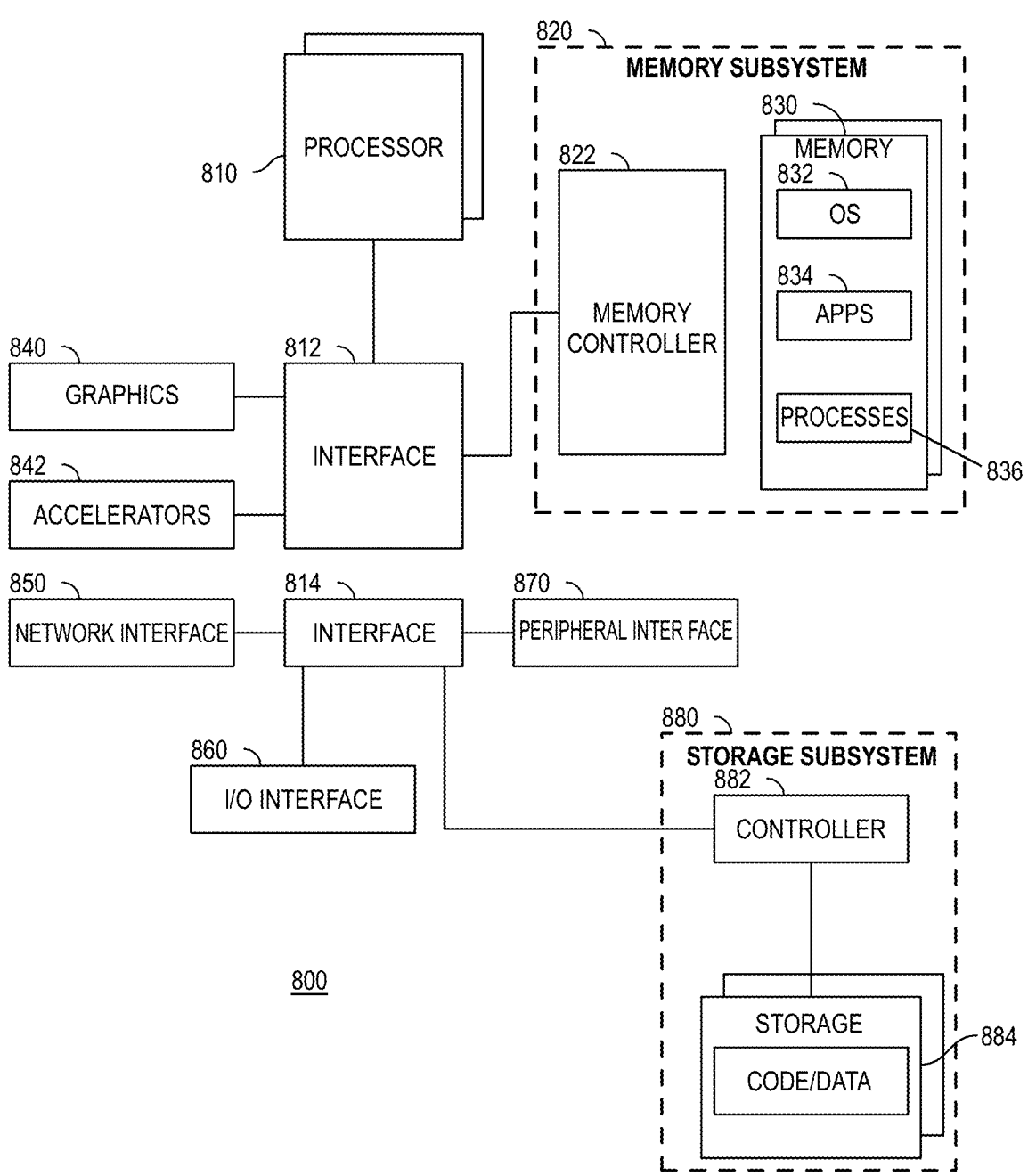
FIG. 8 depicts a system.
Figure 9:
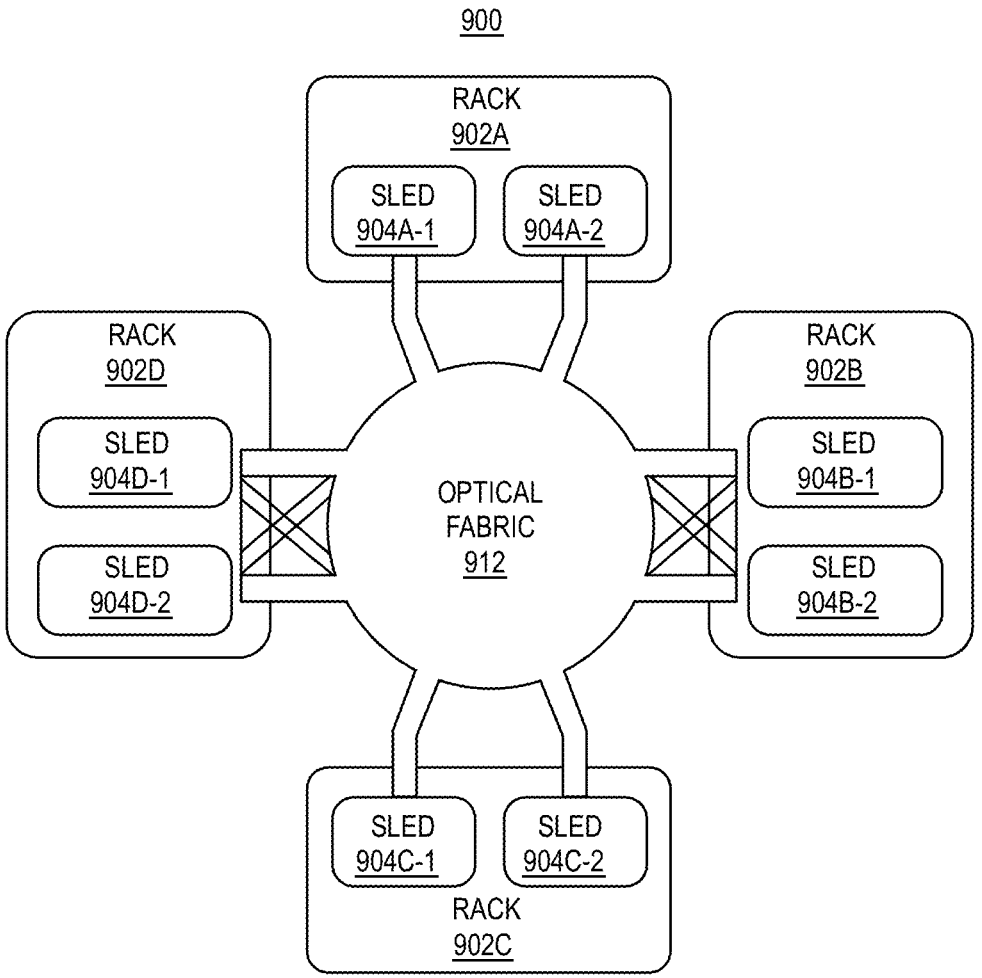
FIG. 9 depicts a data center.
Figure 10:
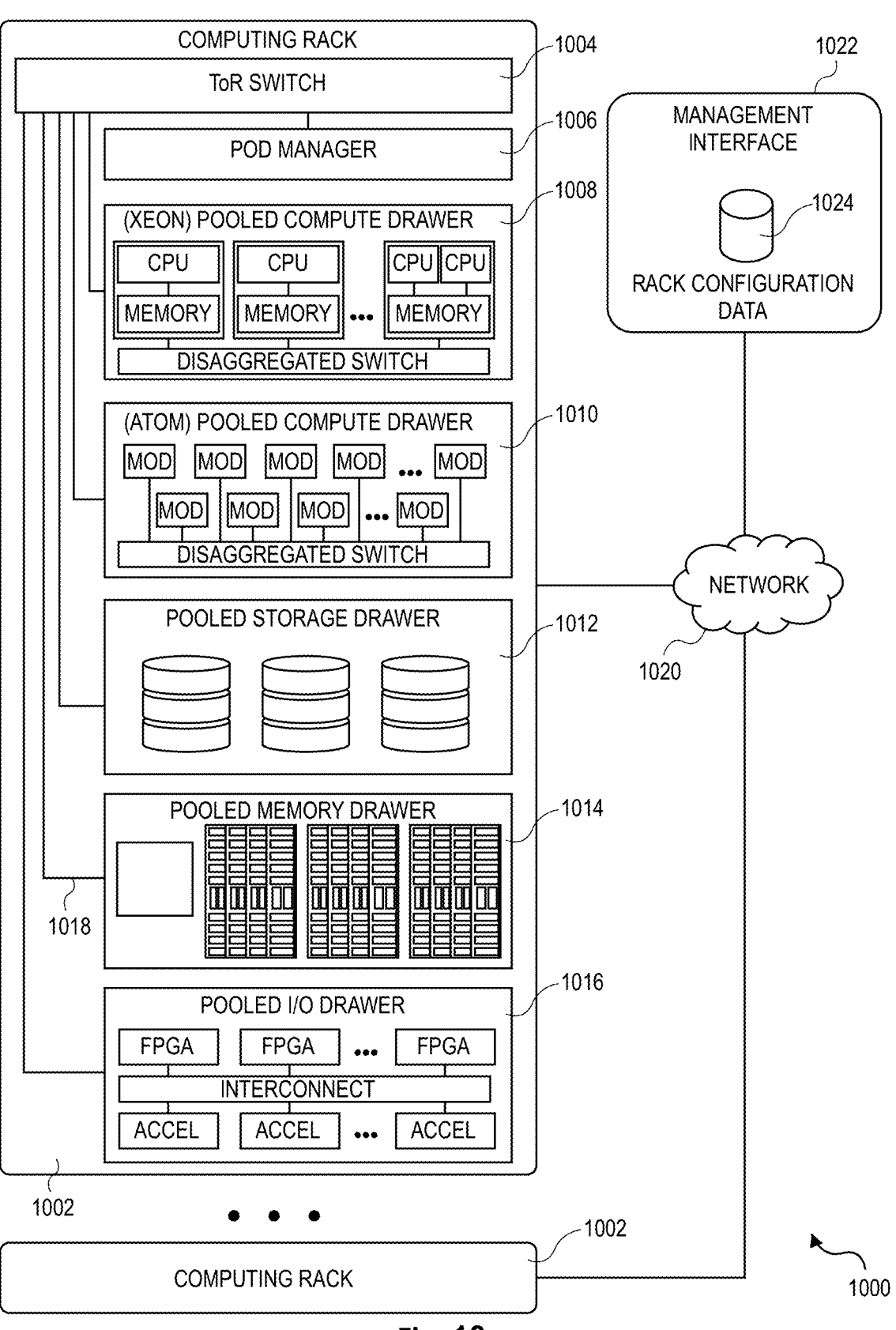
FIG. 10 depicts a rack.

The following discussion concerning FIGS. 8, 9, and 10 are directed to systems, data centers and rack implementations, generally. As such, FIG. 8 generally describes possible features of an electronic system implemented with one or more electronic circuit boards that are immersed in an immersion cooling bath of an immersion cooling system having the improvements described at length above. FIG. 9 describes possible features of a data center having electronic systems composed of electronic circuit boards that are immersed in an immersion bath of an improved immersion cooling system as described at length above. FIG. 10 describes possible features of a rack that is immersed in an immersion bath of an improved immersion cooling system as described at length above.

FIG. 8 depicts an example system. System 800 includes processor 810, which provides processing, operation management, and execution of instructions for system 800. Processor 810 can include any type of microprocessor, central processing unit (CPU), graphics processing unit (GPU), processing core, or other processing hardware to provide processing for system 800, or a combination of processors. Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors to perform such networking functions (e.g., in a pipelined fashion or otherwise).

In one example, system 800 includes interface 812 coupled to processor 810, which can represent a higher speed interface or a high throughput interface for system components that needs higher bandwidth connections, such as memory subsystem 820 or graphics interface components 840, or accelerators 842. Interface 812 represents an interface circuit, which can be a standalone component or integrated onto a processor die. Where present, graphics interface 840 interfaces to graphics components for providing a visual display to a user of system 800. In one example, graphics interface 840 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 840 generates a display based on data stored in memory 830 or based on operations executed by processor 810 or both. In one example, graphics interface 840 generates a display based on data stored in memory 830 or based on operations executed by processor 810 or both.

Accelerators 842 can be a fixed function offload engine that can be accessed or used by a processor 810. For example, an accelerator among accelerators 842 can provide compression (DC) capability, cryptography services such as public key encryption (PKE), cipher, hash/authentication capabilities, decryption, or other capabilities or services. In some embodiments, in addition or alternatively, an accelerator among accelerators 842 provides field select controller capabilities as described herein. In some cases, accelerators 842 can be integrated into a CPU socket (e.g., a connector to a motherboard or circuit board that includes a CPU and provides an electrical interface with the CPU). For example, accelerators 842 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic circuitry, and programmable processing elements such as field programmable gate arrays (FPGAs). Accelerators 842 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 820 represents the main memory of system 800 and provides storage for code to be executed by processor 810, or data values to be used in executing a routine. Memory subsystem 820 can include one or more memory devices 830 such as read-only memory (ROM), flash memory, volatile memory, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processes 836 represent agents or routines that provide auxiliary functions to OS 832 or one or more applications 834 or a combination. OS 832, applications 834, and processes 836 provide software functionality to provide functions for system 800. In one example, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810. In some examples, a system on chip (SOC or SoC) combines into one SoC package one or more of: processors, graphics, memory, memory controller, and Input/Output (I/O) control logic circuitry.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version 3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 800 includes interface 814, which can be coupled to interface 812. In one example, interface 814 represents an interface circuit, which can include stand-alone components and integrated circuitry. In one example, multiple user interface components or peripheral components, or both, couple to interface 814. Network interface 850 provides system 800 the ability to communicate with remote devices (e.g., servers or other computing devices) over one or more networks. Network interface 850 can include an Ethernet adapter, wireless interconnection components, cellular network interconnection components, USB (universal serial bus), or other wired or wireless standards-based or proprietary interfaces. Network interface 850 can transmit data to a remote device, which can include sending data stored in memory. Network interface 850 can receive data from a remote device, which can include storing received data into memory. Various embodiments can be used in connection with network interface 850, processor 810, and memory subsystem 820.

In one example, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one example, system 800 includes storage subsystem 880 to store data in a nonvolatile manner. In one example, in certain system implementations, at least certain components of storage 880 can overlap with components of memory subsystem 820. Storage subsystem 880 includes storage device(s) 884, which can be or include any conventional medium for storing large amounts of data in a non-volatile manner, such as one or more magnetic, solid state, or optical based disks, or a combination. Storage 884 holds code or instructions and data in a persistent state (e.g., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (e.g., the value or state of the data is indeterminate if power is interrupted to system 800). In one example, storage subsystem 880 includes controller 882 to interface with storage 884. In one example controller 882 is a physical part of interface 814 or processor 810 or can include circuits in both processor 810 and interface 814.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 800. More specifically, power source typically interfaces to one or multiple power supplies in system 800 to provide power to the components of system 800. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 800 can be implemented as a disaggregated computing system. For example, the system 800 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Although a computer is largely described by the above discussion of FIG. 8, other types of systems to which the above described invention can be applied and are also partially or wholly described by FIG. 8 are communication systems such as routers, switches, and base stations.

FIG. 9 depicts an example of a data center. Various embodiments can be used in or with the data center of FIG. 9. As shown in FIG. 9, data center 900 may include an optical fabric 912. Optical fabric 912 may generally include a combination of optical signaling media (such as optical cabling) and optical switching infrastructure via which any particular sled in data center 900 can send signals to (and receive signals from) the other sleds in data center 900. However, optical, wireless, and/or electrical signals can be transmitted using fabric 912. The signaling connectivity that optical fabric 912 provides to any given sled may include connectivity both to other sleds in a same rack and sleds in other racks.

Data center 900 includes four racks 902A to 902D and racks 902A to 902D house respective pairs of sleds 904A-1 and 904A-2, 904B-1 and 904B-2, 904C-1 and 904C-2, and 904D-1 and 904D-2. Thus, in this example, data center 900 includes a total of eight sleds. Optical fabric 912 can provide sled signaling connectivity with one or more of the seven other sleds. For example, via optical fabric 912, sled 904A-1 in rack 902A may possess signaling connectivity with sled 904A-2 in rack 902A, as well as the six other sleds 904B-1, 904B-2, 904C-1, 904C-2, 904D-1, and 904D-2 that are distributed among the other racks 902B, 902C, and 902D of data center 900. The embodiments are not limited to this example. For example, fabric 912 can provide optical and/or electrical signaling.

FIG. 10 depicts an environment 1000 that includes multiple computing racks 1002, each including a Top of Rack (ToR) switch 1004, a pod manager 1006, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 1008, and INTEL® ATOM™ pooled compute drawer 1010, a pooled storage drawer 1012, a pooled memory drawer 1014, and a pooled I/O drawer 1016. Each of the pooled system drawers is connected to ToR switch 1004 via a high-speed link 1018, such as a 40 Gigabit/ second (Gb/s) or 100 Gb/s Ethernet link or a 100+ Gb/s Silicon Photonics (SiPh) optical link. In one embodiment high-speed link 1018 comprises a 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 1000 may be interconnected via their ToR switches 1004 (e.g., to a pod-level switch or data center switch), as illustrated by connections to a network 1020. In some embodiments, groups of computing racks 1002 are managed as separate pods via pod manager(s) 1006. In one embodiment, a single pod manager is used to manage all of the racks in the pod. Alternatively, distributed pod managers may be used for pod management operations. RSD environment 1000 further includes a management interface 1022 that is used to manage various aspects of the RSD environment. This includes managing rack configuration, with corresponding parameters stored as rack configuration data 1024.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds, and other design or performance constraints, as desired for a given implementation.

Some examples may be implemented using or as an article of manufacture or at least one computer-readable medium. A computer-readable medium may include a non-transitory storage medium to store program code. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the program code implements various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/ or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An immersion cooling system comprising:
a chamber to hold an electrically insulating liquid into which an electronic circuit board is to be immersed; and a particle collector to collect particles from the electrically insulating liquid, the particle collector including:
an input port to receive the electrically insulating liquid;
an output port to emit the electrically insulating liquid; and
a plurality of baffles separately coupled to one or more walls of the particle collector, the plurality of baffles to create regions of slower movement of the electrically insulating liquid within the particle collector, one or more of the plurality of baffles to be electrified to induce phoretic forces within the particle collector that cause the particles to collect within the particle collector.

2. The immersion cooling system of claim 1, wherein an electric field resulting from the electrification of a first one of the plurality of baffles is to pass through a corresponding region of slower movement of the electrically insulating liquid within the particle collector.

3. The immersion cooling system of claim 1, wherein the particle collector includes one or more second devices to induce phoretic forces within the particle collector, the one or more second devices different than the plurality of baffles, the one or more second devices including one or more of:
a heater;
a cooler;
a transducer;
a vibrator; or
an electrode.

4. The immersion cooling system of claim 1, wherein the particle collector is external from the chamber, the input port is fluidically coupled to the chamber, and the output port is fluidically coupled to the chamber.

5. The immersion cooling system of claim 1, wherein the particles have a size of 1 μm or less.

6. The immersion cooling system of claim 1, wherein the electrification includes exposing a first one of the plurality of baffles to a positive voltage and a second one of the plurality of baffles to a negative voltage.

7. The immersion cooling system of claim 1, wherein a first one of the baffles is oriented at a first angle and a second one of the baffles is oriented at a second angle, the second angle different than the first angle.

8. The immersion cooling system of claim 1, wherein one or more of the plurality of baffles include an opening through which the electrically insulating liquid is to flow.

9. The immersion cooling system of claim 1, wherein the one or more of the plurality of baffles to be electrified include metal.

10. The immersion cooling system of claim 1, wherein an electrical potential associated with a first one of the plurality of baffles is different than an electrical potential of the corresponding wall to which the first one of the plurality of baffles is coupled.

11. The immersion cooling system of claim 1, including a pump fluidly coupled to the chamber and to the particle collector.

12. A particle collector for an immersion cooling system, the particle collector comprising:
an input port to receive an electrically insulating liquid into which an electronic circuit is to be immersed, a chamber of the immersion cooling system to hold the electrically insulating liquid;
an output port to emit the electrically insulating liquid; and
a plurality of baffles separately coupled to one or more walls of the particle collector, the plurality of baffles to create regions of slower movement of the electrically insulating liquid within the particle collector, one or more of the plurality of baffles to be electrified to induce phoretic forces within the particle collector that cause particles to collect within the particle collector.

13. The particle collector of claim 12, wherein an electric field resulting from the electrification of a first one of the plurality of baffles is to pass through a corresponding region of slower movement of the electrically insulating liquid within the particle collector.

14. The particle collector of claim 12, including one or more second devices to induce phoretic forces within the particle collector, the one or more second devices different than the plurality of baffles, the one or more second devices including one or more of:

a heater;

a cooler;

a transducer;

a vibrator; or an electrode.

15. The particle collector of claim 12, wherein the input port is fluidically coupled to the chamber and the output port is fluidically coupled to the chamber.

16. A system comprising:

an electronic circuit board; and an immersion cooling system including:

a chamber to hold an electrically insulating liquid, the electronic circuit board to be immersed in the electrically insulating liquid;

a particle collector to collect particles from the electrically insulating liquid, the particle collector including:

an input port to receive the electrically insulating liquid;

an output port to emit the electrically insulating liquid;

a plurality of baffles separately coupled to one or more walls of the particle collector, the plurality of baffles to create regions of slower movement of the electrically insulating liquid within the particle collector, one or more of the plurality of baffles to be electrified to induce phoretic forces within the particle collector that cause the particles to collect within the particle collector; and a sensor within the electrically insulating liquid to detect a certain type of particle within the electrically insulating liquid.

17. The system of claim 16, wherein the particle collector includes one or more second devices to induce phoretic forces within the particle collector, the one or more second devices different than the plurality of baffles, the one or more second devices including one or more of:

a heater;

a cooler;

a transducer;

a vibrator; or an electrode.

18. The system of claim 16, wherein the particle collector includes a heated copper mesh to induce phoretic forces within the particle collector.

19. The system of claim 16, wherein the particle collector is external from the chamber, the input port is fluidically coupled to the chamber, and the output port is fluidically coupled to the chamber.

20. A method comprising:

immersing an electronic circuit board within an electrically insulating liquid, a chamber of an immersion cooling system to hold the electrically insulating liquid in which the electronic circuit board is to be immersed, the immersion cooling system including an input port to receive the electrically insulating liquid and an output port to emit the electrically insulating liquid;

electrifying one or more baffles of a plurality of baffles to induce phoretic forces within the electrically insulating liquid while the electronic circuit board is in a powered off state to collect, at a particle collector, particles within the electrically insulating liquid, the plurality of baffles separately coupled to one or more walls of the particle collector, the plurality of baffles to create regions of slower movement of the electrically insulating liquid within the particle collector; and after a period of time following the electrification of the one or more baffles, causing the electronic circuit board to be powered on.

*    *    *    *    *